(12) United States Patent
Tu et al.

(10) Patent No.: US 10,361,295 B2
(45) Date of Patent: Jul. 23, 2019

(54) NITRIDE SEMICONDUCTOR EPITAXIAL STACK STRUCTURE AND POWER DEVICE THEREOF

(71) Applicant: EPISTAR CORPORATION, Hsinchu (TW)

(72) Inventors: Shang Ju Tu, Hsinchu (TW); Ya Yu Yang, Hsinchu (TW); Chia Cheng Liu, Hsinchu (TW); Tsung Cheng Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/902,359

(22) Filed: Feb. 22, 2018

(65) Prior Publication Data

US 2018/0240901 A1    Aug. 23, 2018

(30) Foreign Application Priority Data

Feb. 22, 2017  (TW) .............................. 106105894 A

(51) Int. Cl.
| | |
|---|---|
| *H01L 29/00* | (2006.01) |
| *H01L 29/778* | (2006.01) |
| *H01L 29/15* | (2006.01) |
| *G01R 31/26* | (2014.01) |
| *H01L 21/02* | (2006.01) |

(Continued)

(52) U.S. Cl.
CPC .......... *H01L 29/7783* (2013.01); *G01R 31/26* (2013.01); *H01L 21/0254* (2013.01); *H01L 21/02381* (2013.01); *H01L 21/02458* (2013.01); *H01L 21/02507* (2013.01); *H01L 29/151* (2013.01); *H01L 29/7786* (2013.01);
(Continued)

(58) Field of Classification Search
CPC .............. H01L 29/7783; H01L 29/151; H01L 29/2003; H01L 21/02458; H01L 21/0254; H01L 21/02381; H01L 21/02507; H01L 29/7786; H01L 29/872; H01L 29/41758; G01R 31/26
See application file for complete search history.

(56) References Cited

U.S. PATENT DOCUMENTS 8,981,382 B2 * 3/2015 Gao .................... H01L 29/2003
257/76
9,437,724 B2 * 9/2016 Ueno .................. H01L 29/7781
(Continued)

*Primary Examiner* — Nikolay K Yushin
(74) *Attorney, Agent, or Firm* — Muncy, Geissler, Olds & Lowe, P.C.

(57) ABSTRACT

A nitride semiconductor epitaxial stack structure including: a Silicon substrate; an aluminum-including nucleation layer disposed on the silicon substrate; a buffer structure disposed on the aluminum-including nucleation layer and sequentially including: a first superlattice epitaxial structure, a first GaN based thick layer disposed on the first superlattice epitaxial structure, a second superlattice epitaxial structure disposed on the first GaN based thick layer, and a second GaN based thick layer disposed on the second superlattice epitaxial structure; a channel layer disposed on the buffer structure; a barrier layer disposed on the channel layer; and a two dimensional electron gas layer disposed near an interface between the channel layer and the barrier layer, wherein the total thickness of the first GaN based thick layer and the second GaN based thick layer is more than 2 micrometers.

11 Claims, 9 Drawing Sheets

(51) Int. Cl.
*H01L 29/872* (2006.01)
*H01L 21/00* (2006.01)
*H01L 29/20* (2006.01)
*H01L 29/417* (2006.01)

(52) U.S. Cl.
CPC ........ *H01L 29/872* (2013.01); *H01L 29/2003* (2013.01); *H01L 29/41758* (2013.01)

(56) References Cited

U.S. PATENT DOCUMENTS

| | | | |
|---|---|---|---|
| 9,660,066 B2 * | 5/2017 | Li | H01L 29/7786 |
| 2014/0252366 A1 * | 9/2014 | Gao | H01L 29/2003 |
| | | | 257/76 |
| 2015/0303290 A1 * | 10/2015 | Ueno | H01L 29/7781 |
| | | | 257/194 |
| 2016/0211330 A1 * | 7/2016 | Li | H01L 29/7786 |
| 2016/0233329 A1 * | 8/2016 | Cheng | H01L 29/66462 |

* cited by examiner

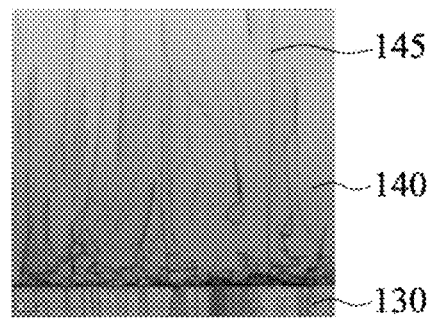
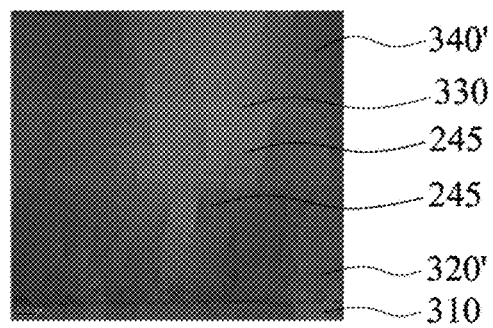
FIG. 3A    FIG. 3B
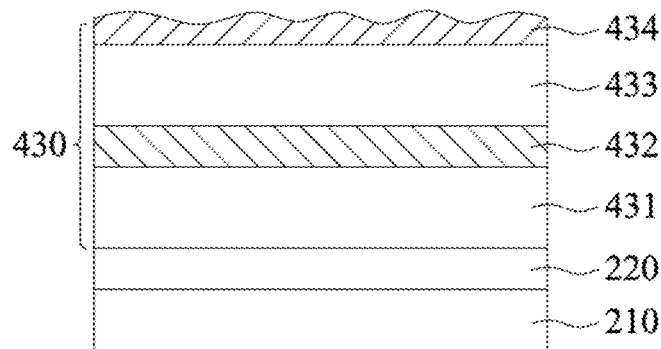
FIG. 4A
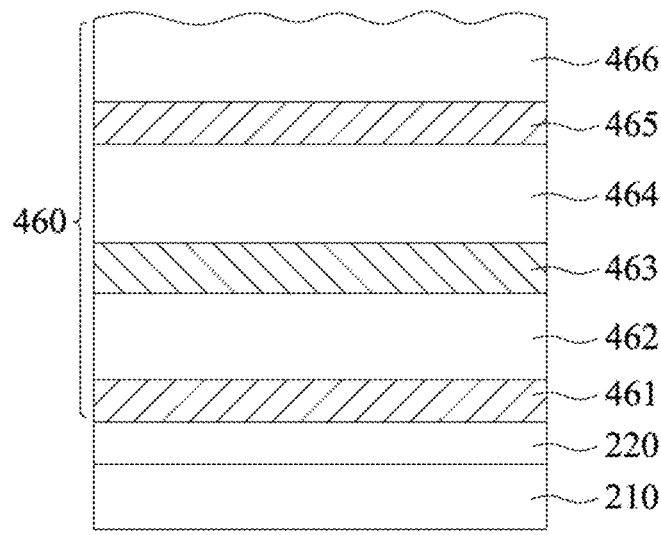
FIG. 4B

NITRIDE SEMICONDUCTOR EPITAXIAL STACK STRUCTURE AND POWER DEVICE THEREOF

TECHNICAL FIELD

The present disclosure relates to a nitride semiconductor epitaxial stack structure and power device thereof, in particular, relates to a nitride semiconductor epitaxial stack structure and power device thereof applied to semiconductor power device.

DESCRIPTION OF THE RELATED ART

In recent years, with the growing demand for high frequency or high power products, a III-V gallium nitride power device using the material thereof is able to operate at high temperature and chemically anti-corrosive because III-V gallium nitride (GaN) materials have an energy band gap of about 3.4 eV and the heat conductivity thereof is larger than 1.5 W/cm. In addition, the endurable breakdown electrical field of a GaN material is 3□10⁶ V/cm and the carrier transfer speed can reach 3□10⁷ cm/s, therefore GaN materials are suitable for microwave high power device and can stand a high voltage applied thereto without collapsing. Therefore, a semiconductor device made of gallium nitride (GaN) materials and having a stack of AlGaN/GaN is widely used in power supplies, DC/DC converters, DC/AC inverters, uninterruptible power supplies, vehicles, motors, and wind powers due to its characteristics of high electron mobility and being able to operate at high frequency, high power, and high temperature.

However, considering efficiency, price and competitiveness, the existing product chooses a substrate material which is cheaper but has different lattice constant and expansion coefficient with nitride semiconductor material. Therefore, because of the differences of lattice constant and expansion coefficient between the substrate material and the nitride semiconductor material, epitaxial defect is easily occurred within an epitaxial layer when forming the epitaxial layer on the substrate. Higher epitaxial defect density may lower the surface flatness of an epitaxial layer, cause crack and then the epitaxial defect extends to the surface of the epitaxial layer. Therefore, it is not easy to form a high quality nitride semiconductor epitaxial stack structure having low epitaxial defect density, a flat surface and less or smaller surface crack. Among various substrate materials, the silicon substrate is widely applied for the growth of nitride semiconductor epitaxial stack structure. However, it is still a topic urgently needed to be solved for growing a high quality nitride semiconductor epitaxial stack structure on a silicon substrate because the function of device made of the nitride semiconductor epitaxial stack structure, such as a power device or a Schottky device can be influenced due to the quality of nitride semiconductor epitaxial stack structure.

Referring to FIG. 1, which illustrates a Transmission Electron Microscope (TEM) image of a conventional nitride semiconductor epitaxial stack structure 100. The nitride semiconductor epitaxial stack structure 100 is manufactured by steps of: firstly, forming an AlN nucleation layer on a silicon substrate 110 by metal-organic chemical vapor deposition (MOCVD) method, and further forming a superlattice stack layer 130 including alternately multiple AlN superlattice layers of a thickness of 18 nm each and GaN superlattice layers of a thickness of 5 nm each by the same MOCVD method, forming a GaN thick layer 140 with thickness larger than 1000 nm by MOCVD method, forming a barrier layer 152 on the GaN thick layer 140, and forming a two-dimensional electron gas (2DEG, not shown) adjacent to a junction between the GaN thick layer 140 and the barrier layer 152.

From FIG. 1, such nitride semiconductor epitaxial stack structure 100 has the superlattice stack layer 130 structure on the bottom thereof, where there are still many defects 145 formed in the GaN thick layer 140 and extended to the upper half of the GaN thick layer 140 or further into the barrier layer 152.

SUMMARY OF THE DISCLOSURE

The present disclosure relates to A nitride semiconductor epitaxial stack structure including: a Silicon substrate; an aluminum-including nucleation layer disposed on the silicon substrate; a buffer structure disposed on the aluminum-including nucleation layer and sequentially including: a first superlattice epitaxial structure, a first GaN based thick layer disposed on the first superlattice epitaxial structure, a second superlattice epitaxial structure disposed on the first GaN based thick layer, and a second GaN based thick layer disposed on the second superlattice epitaxial structure; a channel layer disposed on the buffer structure; a barrier layer disposed on the channel layer; and a two dimensional electron gas layer disposed near an interface between the channel layer and the barrier layer, wherein the total thickness of the first GaN based thick layer and the second GaN based thick layer is more than 2 micrometers.

A semiconductor power device includes: the aforesaid nitride semiconductor epitaxial stack structure; and a source electrode, a gate electrode and a drain electrode, or a cathode electrode and an anode electrode disposed on the aforesaid nitride semiconductor epitaxial stack structure, respectively; wherein the gate electrode is disposed between the source electrode and the drain electrode.

In order to make the aforementioned features and advantages of the present disclosure more comprehensible, embodiments accompanying figures are described in details below.

BRIEF DESCRIPTION OF THE DRAWINGS

FIG. 3A is a partially enlarged TEM image including a buffer structure of a conventional nitride semiconductor epitaxial stack structure.

FIG. 3B is a partially enlarged TEM image including a buffer structure of a nitride semiconductor epitaxial stack structure disclosed in a second embodiment of the present disclosure.

FIGS. 4A to 4C illustrate side-view schematic diagrams of partial epitaxial stack structures including a buffer structures of nitride semiconductor epitaxial stack structure disclosed in third to fifth embodiments, respectively.

DETAILED DESCRIPTION OF THE DISCLOSURE

Figure 1:
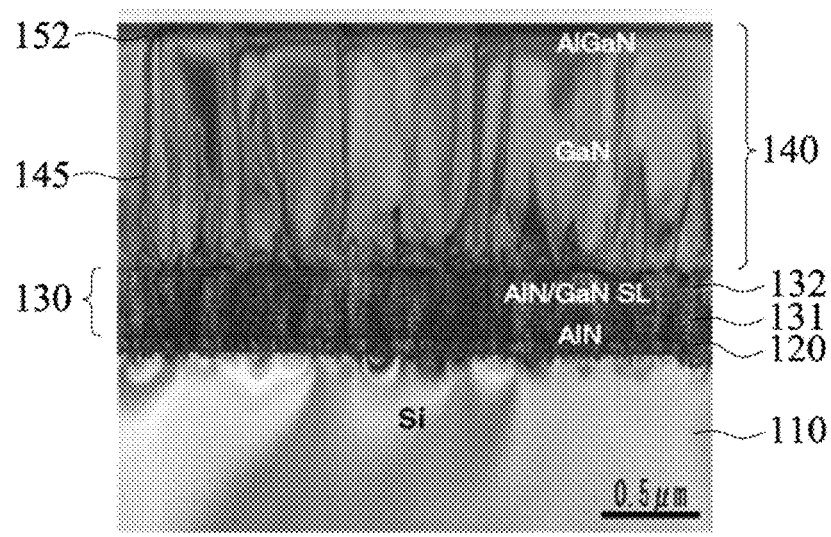
FIG. 1 is a Transmission Electron Microscope (TEM) image of a conventional nitride semiconductor epitaxial stack structure.

A description accompanied with drawings is provided in the following to explain embodiments of the present application. However, the disclosure may still be implemented in many other different forms and should not be construed as limited to the embodiments described herein. In the drawings, for the purpose of clarity, the sizes and relative sizes of each layer and region in the drawings may be illustrated in exaggerated proportions.

Figure 2:
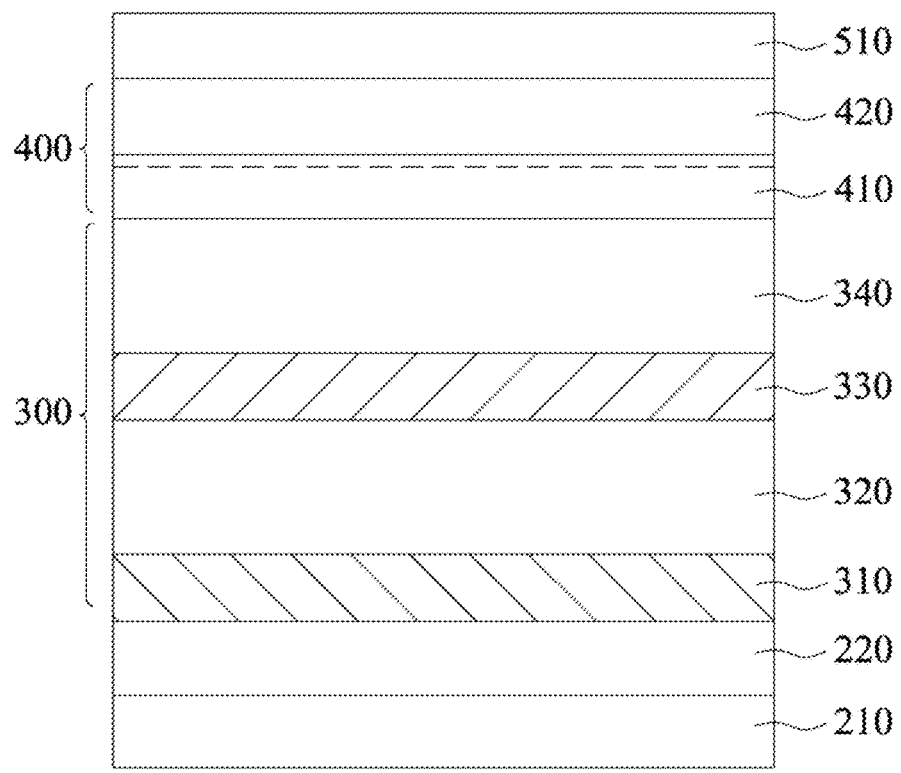
FIG. 2 is a schematic diagram of a nitride semiconductor epitaxial stack structure disclosed in a first embodiment of the present disclosure.

Referring to FIG. 2, a schematic diagram of a nitride semiconductor epitaxial stack structure 200 of a first embodiment of the present disclosure is illustrated. The nitride semiconductor epitaxial stack structure 200 includes a silicon substrate 210, an AlN nucleation layer 220 formed on the silicon substrate 210, and a buffer structure 300 formed on the AlN nucleation layer 220. The buffer structure 300 from bottom to top sequentially includes: a first superlattice epitaxial structure 310 alternately stacked by first Aluminum Gallium Nitride superlattice layers ($Al_{x1}Ga_{1-x1}N$) with thickness $d_1$ and second Aluminum Gallium Nitride superlattice layers ($Al_{y1}Ga_{1-y1}N$) with thickness $d_2$; a first Aluminum Gallium Nitride thick layer 320 ($A_{z1}Ga_{1-z1}N$) thicker than 1000 nm; a second superlattice epitaxial structure 330 alternately stacked by third Aluminum Gallium Nitride superlattice layers ($Al_{x2}Ga_{1-x2}N$) with thickness $d_3$ and fourth Aluminum Gallium Nitride superlattice layers ($Al_{y2}Ga_{1-y2}N$) with thickness $d_4$; a second Aluminum Gallium Nitride thick layer 340 ($A_{z2}Ga_{1-z2}N$) thicker than 1000 nm. Then, a function structure 400 is formed on the buffer structure 300. The function structure 400 includes a channel layer 410 composed of $Al_aGa_{1-a}N$, $0 \le a < 1$ and a barrier layer 420 composed of $Al_bGa_{1-b}N$, $0 \le b < 1$, and $a < b$. Finally, a cap layer 510 is further formed on the barrier layer 420 and is composed of undoped Gallium Nitride.

In the present embodiment, 2DEG can be generated near the interface of the Gallium Nitride channel layer 410 and the Aluminum Gallium Nitride barrier layer 420. In another embodiment, the function structure can be the active layer (not shown) of a light-emitting diode device, and when a current is injected into the light-emitting diode device, holes and electrons recombine in the active layer to emit light.

In the present embodiment, the nitride semiconductor epitaxial stack structure 200 are formed by growing the AlN nucleation layer 220 on the surface with an (111) lattice plane of the substrate 210 along direction [0001]. Notably, the material of the substrate 210 can be semiconductor material or oxide material and is not limited to silicon. The aforesaid semiconductor material can include Si, GaN, SiC, GaAs, or AlN. The aforesaid oxide material can include sapphire. In addition, the substrate 210 can be distinguished into a conductive substrate or an insulative substrate depending on the electric conductivity thereof. The aforesaid conductive substrate includes Si substrate, GaN substrate, or GaAs substrate. The aforesaid insulative substrate includes sapphire substrate, Silicon on insulator (SOI) substrate, or AlN substrate. In addition, the substrate 210 can be selectively doped an impurity therein to change the conductivity thereof, therefore the substrate 210 can be a conductive substrate or an insulative substrate. For the Si substrate, it can have electric conductivity by doping B, As or P. In the present embodiment, the substrate 210 is a p-type (doped with B) silicon substrate, which is therefore conductive, with a thickness of 175~1500 μm.

Then, epitaxially growing the aforesaid AlN nucleation 220 on the (111) surface of the Si substrate 210. The AlN nucleation layer 220 is grown along the [0001] direction, and the thickness thereof is about dozens or hundreds nanometer for reducing the lattice mismatch with above semiconductor layer. The way to make epitaxial growth can include physical vapor deposition (PVD), atomic layer deposition (ALD), metal-organic chemical vapor deposition, MOCVD) or molecular-beam epitaxy (MBE). With the AlN nucleation layer 220, the semiconductor epitaxial layer such as buffer structure or channel layer above the AlN nucleation layer 220 can have a better epitaxial quality. The material of the AlN nucleation layer 220 can be III-V group semiconductor material, including AlN, GaN, AlGaN or a stack composed thereof. The structure of the AlN nucleation 220 can be amorphous, polycrystal, single crystal or a mixed layer with different crystal quality. In the present embodiment, the material of the AlN nucleation layer 220 is AlN, and the thickness of the AlN nucleation layer 220 is about 20~50 nm, and the AlN nucleation layer 220 is formed by MOCVD.

After forming the AlN nucleation layer 220, a buffer structure 300 is grown on the AlN nucleation layer 220. Similar to aforesaid description, the buffer structure 300 can be used to reduce the lattice mismatch and lower the density of epitaxial defect. The manufacturing method of the buffer structure 300 is similar to aforesaid method, such as one of following method: physical vapor deposition (PVD), atomic layer deposition (ALD), metal-organic chemical vapor deposition, MOCVD) or molecular-beam epitaxy (MBE). With the buffer structure 300, a function structure 400 having low-density epitaxial defect, flat surface, less and/or smaller surface crack can be formed on the buffer structure 300. In the present embodiment, the buffer structure is composed of four parts below and formed by MOCVD, and the growing steps are described below.

Firstly, a first superlattice epitaxial structure 310 alternately stacked by first Aluminum Gallium Nitride superlattice layers ($Al_{x1}Ga_{1-x1}N$) with thickness $d_1$ and second Aluminum Gallium Nitride superlattice layers ($Al_{y1}Ga_{1-y1}N$) with thickness $d_2$ is formed on the AlN nucleation layer 220. To prevent extra stress resulting from large difference of lattice constant between the first superlattice epitaxial structure 310 and the AlN nucleation layer 220 below, the range of average Al-containing percentage of the two superlattice layers is $0.3 \le (x_1 \times d_1 + y_1 \times d_2)/(d_1+d_2) \le 1$, $x_1 \ne y_1$. In addition, in accordance with the structure characteristic of the first super lattice structure 310, the cumulative stress in the semiconductor epitaxial stack structure 200 can be released, and the lattice defect resulting from the lattice mismatch between the Si substrate 210 and the AlN nucleation layer 220 or stress can be interrupted. The lattice defect is extended along a direction perpendicular to the surface of Si substrate and continues to the upper part of the semiconductor epitaxial stack structure 200 so the epitaxial quality of the channel layer 410 above is affected. When the defect reaches the surface, cracks may occur. Here, with an appropriate average composition ratio of Aluminum by the equation: $0.3 \leq (x_1 \times d_1 + y_1 \times d_2)/(d_1+d_2) \leq 1$, the lattice constant difference between the first superlattice epitaxial structure 310 and the AlN nucleation layer 220 can be reduced to decrease the stress and the cracks generated on the surface of the epitaxial stack layer. In the present embodiment, the first superlattice epitaxial structure 310 includes 100 layers (50 pairs) and is formed by MOCVD method, but the actual number of layers is not limited thereto. A number of layers can be from 20 layers (10 pairs) to 300 layers (150 pairs). According to the experiment based on the present embodiment, when the number of the layers is less than 20 layers, the superlattice structure has limited ability to reduce stress accumulation and epitaxial defects, and make the semiconductor epitaxial layer have an insufficient thickness with excessive or large cracks. When the number of the layers of the first superlattice epitaxial structure 310 exceeds 300 layers, the duration of the epitaxial growth process may be too long which is adverse to the process economy of entire semiconductor epitaxial stack structure 200, and some side effect such as a degradation on the surface of the superlattice structure or an unexpected stress may occur due to the excessively thick superlattice structure itself.

In addition, in another embodiment, the first superlattice epitaxial structure 310 can be doped with impurity such as C or Fe to increase the internal resistance of the first superlattice epitaxial structure 310. In the present embodiment, the first superlattice epitaxial structure 310 formed by MOCVD method is an AlGaN layer doped with impurity C. In the present embodiment, the doped impurity C can be doped intentionally or unintentionally. A preferred concentration range of C impurity measured by Secondary Ion Mass Spectrometer (SIMS) is between $5 \times 10^{17}/cm^3$ and $1 \times 10^{20}/cm^3$. When the impurity concentration is under $5 \times 10^{17}/cm^3$, the resistance of the first superlattice epitaxial structure 310 is too low for the power device formed later to resist injected voltage and is not able to provide a higher breakdown voltage. When the impurity concentration is over $1 \times 10^{20}/cm^3$, such high impurity concentration may cause epitaxial defect in the first superlattice epitaxial structure 310.

Then, forming a first GaN-based ($Al_{z1}Ga_{1-z1}N$) thick layer 320 on the first superlattice epitaxial structure 310 by MOCVD method. Here, the composition of the first GaN-based thick layer 320 may be a pure GaN layer or an AlGaN layer having low Al concentration. Wherein, by properly adding Al element in a range of $0 \leq Z_1 \leq 0.05$ for example, can broaden the bandgap of the first GaN-based thick layer 320, and in theory, the power device having such nitride semiconductor epitaxial stack structure 200 can have the ability to resist higher vertical operation voltage, which means a higher device break down voltage. Similarly, the first GaN-based thick layer 320 can also be doped with impurity such as C or Fe to increase the internal resistance thereof. In the present embodiment, the first GaN-based thick layer 320 formed by MOCVD method is an AlGaN layer doped with impurity C. In the present embodiment, the doped impurity C can be doped intentionally or unintentionally. A preferred concentration range of C impurity measured by Secondary Ion Mass Spectrometer (SIMS) is between $5 \times 10^{17}/cm^3$ and $1 \times 10^{20}/cm^3$. When the impurity concentration is under $5 \times 10^{17}/cm^3$, the resistance of the first superlattice epitaxial structure 310 is too low for the power device formed later to resist injected voltage and is not able to provide a higher breakdown voltage. When the impurity concentration is over $1 \times 10^{20}/cm^3$, such high impurity concentration may cause epitaxial defect in the first GaN based thick layer 320.

Then, forming a second superlattice epitaxial structure 330 alternately stacked by third Aluminum Gallium Nitride superlattice layers ($Al_{x2}Ga_{1-x2}N$) with thickness $d_3$ and fourth Aluminum Gallium Nitride superlattice layers ($Al_{y2}Ga_{1-y2}N$) with thickness $d_4$ on the first GaN based thick layer 320. To prevent extra stress resulting from large difference of lattice constant between the second superlattice epitaxial structure 330 and the first GaN based thick layer 320 below, the better range of average Al-containing percentage of the two superlattice layers is $0 \leq (x_2 \times d_3 + y_2 \times d_4)/(d_3+d_4) \leq 0.05$, $x_2 \neq y_2$, and each layer is preferably not thicker than 50 nm. In accordance with the structure characteristic of the second super lattice structure 330, the cumulative stress in the semiconductor epitaxial stack structure 200 can be released, and the lattice defect resulting from the lattice mismatch or stress can be continuously interrupted. The lattice defect is extended along a direction perpendicular to the surface of Si substrate 210 and continues to extend upward along with the growth of the following semiconductor epitaxial stack layers. Here, with an appropriate average composition ratio of Aluminum by the equation: $0 \leq (x_2 \times d_3 + y_2 \times d_4)/(d_3+d_4) \leq 0.05$, the lattice constant difference between the first GaN-based thick layer 320 and the second super lattice structure 330 can be reduced to decrease the stress and the cracks generated on the surface of the epitaxial stack layer. In the present embodiment, the second superlattice epitaxial structure 330 includes 60 layers (30 pairs) and is formed by MOCVD method, but the actual number of layers is not limited thereto. A number of layers can be from 20 layers (10 pairs) to 300 layers (150 pairs). According to the experiment based on the present embodiment, when the number of the layers is less than 20 layers, the superlattice structure has limited ability to reduce stress accumulation and epitaxial defects, and make the semiconductor epitaxial layer have an insufficient thickness with excessive or large cracks. When the actual number of layers the second superlattice epitaxial structure 330 exceeds 300 layers, the duration of epitaxial growth process may too long which is adverse to the process economy of entire semiconductor epitaxial stack structure 200, and some side effect such as a degradation on the surface of the superlattice structure or an unexpected stress may occur due to the excessively thick superlattice structure itself.

Finally, further forming a second GaN-based ($Al_{z2}Ga_{1-z2}N$) thick layer 340 on the second superlattice epitaxial structure 330 by MOCVD method. Here, the composition of the second GaN based thick layer 340 may be a pure GaN layer or an AlGaN layer having low Al concentration. Wherein, by properly adding Al element in a range of $0 \leq Z_2 \leq 0.05$ for example, can broaden the bandgap of the second GaN-based thick layer 340, and in theory, the power device having such nitride semiconductor epitaxial stack structure 200 can have the ability to resist higher vertical operation voltage, which means a higher device break down voltage. Similarly, the second GaN-based thick layer 340 can be doped with impurity such as C or Fe to increase the internal resistance thereof. In the present embodiment, the second GaN-based thick layer 340 formed by MOCVD method is an AlGaN layer doped with impurity C. In the present embodiment, the doped impurity C can be doped intentionally or unintentionally. A preferred concentration range of C impurity measured by Secondary Ion Mass Spectrometer (SIMS) is between $5\times10^{17}/cm^3$ and $1\times10^{20}/cm^3$. When the impurity concentration is under $5\times10^{17}/cm^3$, the resistance of the second GaN-based thick layer 340 is too low for the power device formed later to resist injected voltage and is not able to provide a higher breakdown voltage. When the impurity concentration is over $1\times10^{20}/cm^3$, such high impurity concentration may cause epitaxial defect in the second GaN-based thick layer 340.

Similarly, the second superlattice epitaxial structure 330 can also be doped with impurity such as C or Fe to increase the internal resistance of the second superlattice epitaxial structure 330. In the present embodiment, the second superlattice epitaxial structure 330 formed by MOCVD method is an AlGaN layer doped with impurity C. Similarly, in the present embodiment, the doped impurity C can be doped intentionally or unintentionally. A preferred concentration range of C impurity measured by Secondary Ion Mass Spectrometer (SIMS) is between $5\times10^{17}/cm^3$ and $1\times10^{20}/cm^3$. When the impurity concentration is under $5\times10^{17}/cm^3$, the resistance of the second superlattice epitaxial structure 330 is too low for the power device formed later to resist injected voltage. When the impurity concentration is over $1\times10^{20}/cm^3$, such high impurity concentration may cause epitaxial defect in the second superlattice epitaxial structure 330.

After finishing the buffer structure 300, the function structure 400 can be subsequently formed on the buffer structure 300. The method of epitaxial growth can be referred to aforesaid growth method, and no more explanation here. In the present embodiment, the function structure 400 of the power device includes a channel layer 410 and a barrier layer 420. The channel layer 410 having a 50~500 nm thickness range is formed on the buffer structure 300 and composed by III-V nitride materials having a first bandgap, and the barrier layer 420 having a 10~50 nm thickness range is formed on the channel layer 410 and composed by III-V nitride materials having a second bandgap. Wherein the second bandgap is larger than the first bandgap, therefore the lattice constant of the barrier layer 420 is smaller than that of the channel layer 410. Wherein, the channel layer 410 can be composed by a pure GaN layer or an Aluminum Gallium Nitride series ($Al_aGa_{1-a}N$) material formed by properly adding low Al concentration AlGaN, $0\leq a\leq 0.05$, and the barrier layer 420 includes $Al_bGa_{1-b}N$, $0<b<1$, and $a<b$. The channel layer 410 and the barrier layer 420 form spontaneous polarization themselves and form piezoelectric polarization because of different lattice constants, so as to form 2DEG in the heterojunction between the channel layer 410 and the barrier layer 420, which is indicated by the dotted line presented in FIG. 2. In the present embodiment, the channel layer and the barrier layer 420 are formed by MOCVD method. The material of the channel layer 410 is GaN, and the material of the barrier layer 420 is AlN which is an undoped intrinsic semiconductor. The present disclosure is not limited to the present embodiment, instead, each semiconductor characteristic of the barrier layer 420 and the channel layer 410 can be changed by doping a donor impurity or an acceptor impurity therein depending on the demand of device function thereof. The location for forming 2DEG is not limited to within the channel layer 410 as shown in FIG. 2 of the present embodiment, and can be located in the barrier layer 420 in different embodiments.

In the present embodiment, to decrease unnecessary stress accumulation, when the material of the AlN nucleation layer 220 has higher Al concentration, such as AlN, and the material of the function structure such as channel layer 410 has lower Al concentration, such as GaN, the Al composition ratio of all or a part of the multiple layers of the buffer structure 300 can be adjusted so that the Al composition ratio thereof is also between the Al composition ratio of nucleation layer 220 and the Al composition ratio of the functional structure 400, and the Al composition ratio is gradually changed along the epitaxial growth direction. Wherein, the way of the gradual change of the Al composition ratio can be continuous or discontinuous. For example, as shown in the present embodiment, the Al composition ratio of the AlN nucleation layer 220≥the average Al composition ratio of the first superlattice epitaxial structure 310≥the Al composition ratio of the first GaN-based thick layer 320≥the average Al composition ratio of the second superlattice epitaxial structure 330≥the Al composition ratio of the second GaN-based thick layer 340.

In another embodiment, the channel layer 410 of the nitride semiconductor epitaxial layer can be formed in together with the second GaN-based thick layer 340. That is, the second superlattice epitaxial structure 330 can have a second GaN-based semiconductor layer formed thereon (not shown), wherein the upper half of the second GaN-based semiconductor layer forms the channel layer 410, and the lower half of the second GaN-based semiconductor layer forms the second GaN based thick layer 340. The barrier layer 420 is formed on the second GaN-based semiconductor layer, and 2DEG is formed near the junction between the barrier layer 420 and the channel layer 410.

Additionally, after growing the barrier layer 420, a cap layer 510 can be grown above the barrier layer 420 by selectively using any of the listed growing method, and no more explanation here. In the present embodiment, the cap layer 510 can be an undoped GaN semiconductor layer and approximately covers the surface of the carrier layer 420 for preventing the surface of the barrier layer 420 from degrading caused by oxidation, and the current leakage of the surface of the barrier layer 420 can be improved. Notably, for the good electric contact between the electrode structure to be subsequently formed and the barrier layer 420, the cap layer 510 has a thickness between 0~20 nm for electrons tunneling through the cap layer 510 via the electrode structure.

Referring to FIGS. 3A and 3B, which illustrate a partial enlarged TEM image including a buffer structure of a conventional nitride semiconductor epitaxial stack structure and a partial enlarged TEM image including a buffer structure of a nitride semiconductor epitaxial stack structure of a second embodiment of the present disclosure respectively. As shown in FIG. 3A, the buffer structure of the partial epitaxial stack layer 100' includes a superlattice stack layer 130 and a GaN thick layer 140, and in FIG. 3B, the buffer structure 300 of the partial epitaxial stack layer 200' includes the first superlattice epitaxial layer 310, the first GaN-based thick layer 320', the second rsuperlattice epitaxial layer 330, and the second GaN-based thick layer 340'. According to the figure, in the partial epitaxial stack layer 100', there are still a lot of the epitaxial defects extended from the superlattice stack layer 130 to the above GaN thick layer 140; on the contrary, as shown in FIG. 3B, the difference between the second and first embodiments is that the thickness of the first GaN-based thick layer 320' is 1.3 μm, and the thickness of the second GaN-based thick layer 340' is 0.9 μm. According to the figure, in the partial epitaxial stack layer 200', a part of the epitaxial defects 245 in the first GaN-based thick layer 320' are turned or terminated and another part of the epitaxial defects 245 is interrupted in the second superlattice epitaxial layer 330. Furthermore, another part of the epitaxial defects 245 are turned or terminated in the second GaN-based thick layer 340'. Accordingly, comparing to the conventional partial epitaxial stack layer 100', the epitaxial defects can be largely decreased by using the partial epitaxial stack layer 200' in accordance with the second embodiment of the present disclosure, and the surface cracks of the function structure subsequently formed can be decreased as well, therefore the epitaxial quality is improved and the power device composed of the nitride semiconductor epitaxial stack layer 200' can have better performance. From the experimental result, it can be found that the total thickness of the first GaN-based thick layer 320' and the second GaN-based thick layer 340' contributes to the turning or termination of the epitaxial defects 245 in the nitride semiconductor epitaxial stack layer 200'. As shown in the result of the first and second embodiments, a better situation is that the total thickness of the two GaN-based thick layers is thicker than 2 μm.

Figure 4C:
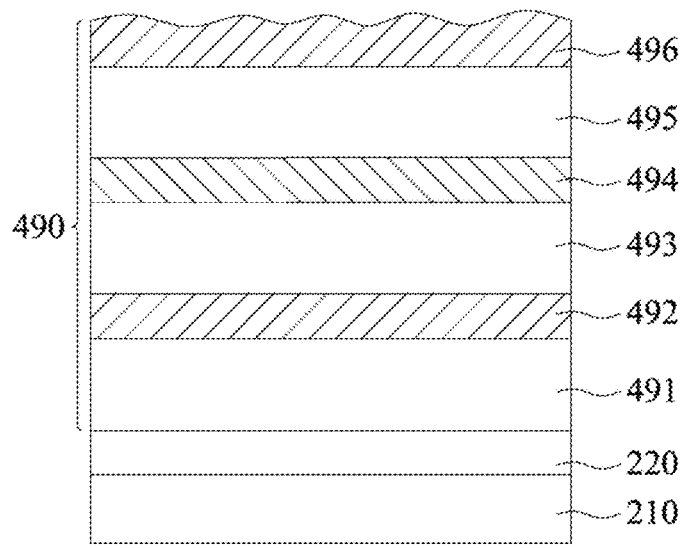

Referring to FIGS. 4A to 4C, side-view schematic diagrams of partial epitaxial stack structures including buffer structures 430, 460, and 490 of the nitride semiconductor epitaxial stack structures from third to fifth embodiments are illustrated respectively. FIG. 4A shows a side-view schematic diagram of partial epitaxial stack structure including buffer structures 430 of the nitride semiconductor epitaxial stack structures of the third embodiment. The difference of the nitride semiconductor epitaxial stack structure between the present embodiment and the first embodiment is the difference between the buffer structure 430 and the buffer structure 300, and other parts of the present embodiment are the same as those in the first embodiment. In the present embodiment, above the AlN nucleation layer 220, the buffer structure 430 sequentially includes a first GaN-based thick layer 431, a first superlattice epitaxial structure 432, a second GaN-based thick layer 433 and a second superlattice epitaxial structure 434. That is, in the present embodiment, the buffer structure 430 includes two groups of a GaN-based thick layer and a superlattice epitaxial structure, and the growth sequence in the present embodiment is reversed comparing to that of the first embodiment, which means the superlattice epitaxial structure is firstly grown and then the GaN-based thick layer is grown when forming the buffer structure 300 of the first embodiment. Then, one or multiple layers of function structure can be formed on the buffer structure 430 subject to different demands.

Wherein, to decrease unnecessary stress accumulation resulted from the lattice constant difference, when the material of the nucleation layer 220 has higher Al concentration, such as AlN, and the material of the function structure such as channel layer (not shown) has lower Al concentration, such as GaN, the Al composition ratio of all or a part of the multiple layers of the buffer structure 430 between the nucleation layer 220 and the channel layer can be adjusted so that the Al composition ratio thereof is also between the Al composition ratio of nucleation layer 220 and the Al composition ratio of the functional structure, and the Al composition ratio is gradually changed along the epitaxial growth direction. Wherein, the way of the change of the Al composition ratio can be continuous or discontinuous. For example, as shown in the present embodiment, the Al composition ratio of the AlN nucleation layer 220≥the Al composition ratio of the first GaN based thick layer 431≥the average Al composition ratio of the first superlattice epitaxial structure 432≥the Al composition ratio of the second GaN based thick layer 433≥the average Al composition ratio of the second superlattice epitaxial structure 434.

FIG. 4B shows a side-view schematic diagram of partial epitaxial stack structure including buffer structures 460 of the nitride semiconductor epitaxial stack structures of the fourth embodiment. Different from the first embodiment, in the present embodiment, after the AlN nucleation layer 220 is formed on the Si substrate 210, a superlattice epitaxial structure 461, a first GaN-based thick layer 462, a second superlattice epitaxial structure 463, a second GaN-based thick layer 464, a third superlattice epitaxial structure 465 and a third GaN-based thick layer 466 are sequentially formed on the AlN nucleation 220 to form the buffer structure 460. That is, in the present embodiment, the buffer structure 460 includes three groups of a GaN-based thick layer and a superlattice epitaxial structure, and has one more group of superlattice epitaxial structure and GaN-based thick layer comparing to the third embodiment. Notably, all of the buffer structure having more than two groups of superlattice structure and GaN thick layer composition can reach the spirit of the present disclosure, and the groups number are not limited to the present embodiment.

Wherein, to decrease unnecessary stress accumulation resulted from the lattice constant difference, when the material of the nucleation layer 220 has higher Al concentration, such as AlN, and the material of the function structure such as channel layer (not shown) has lower Al concentration, such as GaN, a preferred embodiment of the buffer structure 460 is that adjusting the Al composition ratio of all or a part of the multiple layers structure of the nitride semiconductor epitaxial stack layer between the Al composition ratio of the nucleation layer 220 and the Al composition ratio of the function structure, and the Al composition ratio is gradually changed along the epitaxial growth direction. Wherein, the way of the gradual change of the Al composition ratio can be continuous or discontinuous. For example, as shown in the present embodiment, the Al composition ratio of the AlN nucleation layer 220≥the average Al composition ratio of the first superlattice epitaxial structure 461≥the Al composition ratio of the first GaN based thick layer 462≥the average Al composition ratio of the second superlattice epitaxial structure 463≥the Al composition ratio of the second GaN based thick layer 464≥the average Al composition ratio of the third superlattice epitaxial structure 465≥the Al composition ratio of the third GaN based thick layer 466.

FIG. 4C shows a side-view schematic diagram of partial epitaxial stack structure including buffer structures 490 of the nitride semiconductor epitaxial stack structures of the fifth embodiment. Different from the fourth embodiment, in the present embodiment, the buffer structure 490 sequentially includes: a first GaN-based thick layer 491, a first superlattice epitaxial structure 492, a second GaN-based thick layer 493, a second superlattice epitaxial structure 494, a third GaN-based thick layer 495 and a third superlattice epitaxial structure 496. That is, in the present embodiment, the buffer structure 490 includes three groups of a GaN-based thick layer and a superlattice epitaxial structure, and has one more group of superlattice epitaxial structure and GaN-based thick layer comparing to the third embodiment. In addition, the growth sequence of the present embodiment is contrary to that of the fourth embodiment in which the buffer structure 460 of the fourth embodiment starts from the superlattice structure and then the GaN thick layer. Notably, all of the buffer structure having more than two groups of superlattice structure and GaN thick layer composition can reach the spirit of the present disclosure, and the groups number are not limited to the present embodiment.

Wherein, to decrease unnecessary stress accumulation, when the material of the AlN nucleation layer 220 has higher Al concentration, such as AlN, and the material of the function structure such as channel layer (not shown) has lower Al concentration, such as GaN, the Al composition ratio of all or a part of the multiple layers of the buffer structure 490 between the nucleation layer 220 and the channel layer can be adjusted so that the Al composition ratios thereof is also between the Al composition ratio of nucleation layer 220 and the Al composition ratio of the functional structure, and the Al composition ratio is gradually changed along the epitaxial growth direction. Wherein, the way of the gradual change of the Al composition ratio can be continuous or discontinuous. For example, as shown in the present embodiment, the Al composition ratio of the AlN nucleation layer 220 the Al composition ratio of the first GaN based thick layer 491≥the average Al composition ratio of the first superlattice epitaxial structure 492≥the Al composition ratio of the second GaN based thick layer 493≥the average Al composition ratio of the second superlattice epitaxial structure 494≥the Al composition ratio of the third GaN based thick layer 495≥the average Al composition ratio of the third superlattice epitaxial structure 496.

Figure 5:
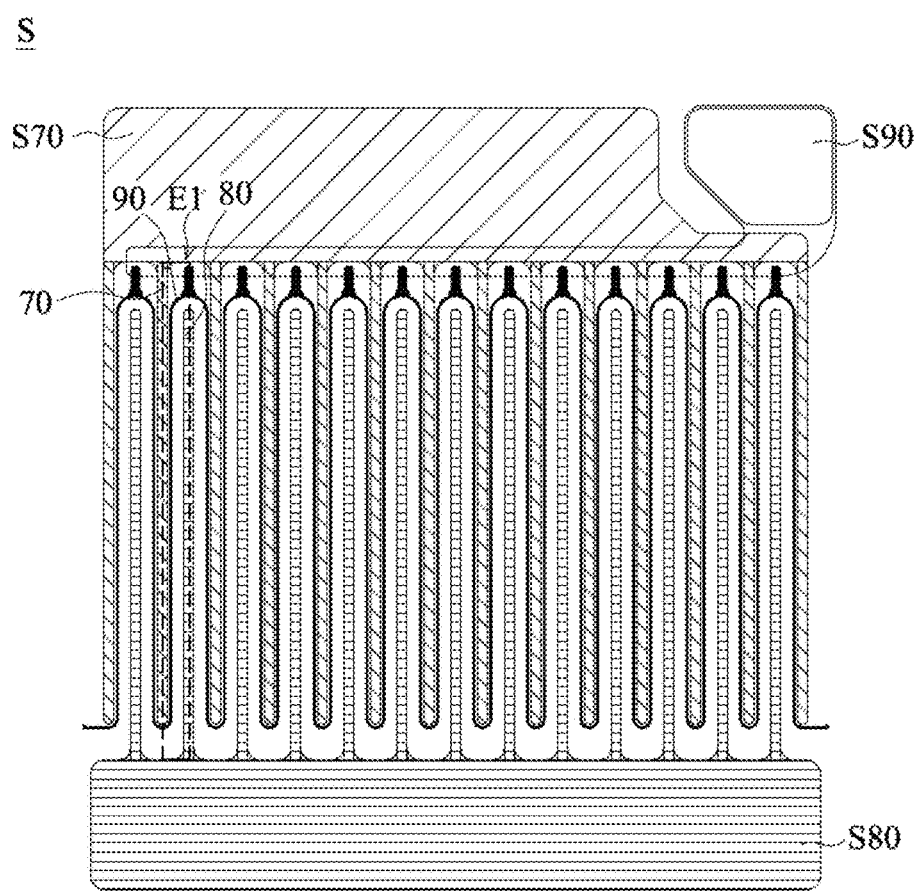
FIG. 5 is a top view diagram of a power device adopting the nitride semiconductor epitaxial stack structure of a sixth embodiment of the present disclosure.

Then, referring to FIGS. 5, 6, 7A-7B. FIG. 5 is a top view in accordance with a sixth embodiment of the present disclosure. The power device S can be a device with three end points. In the present embodiment, the power device S includes a source electrode pad S70, a drain electrode pad S80, a gate electrode pad S90 and a power device unit E1. The power device unit E1 can be a FET, and to be more specific, can be a HEMT.

Figure 6A:
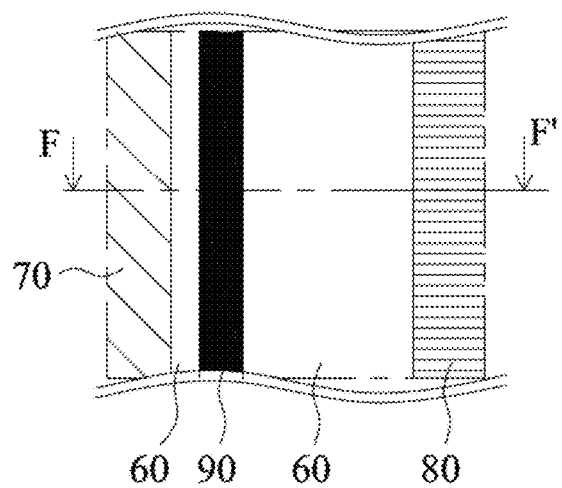
FIG. 6A is a top view of partial-enlarged schematic diagram of a power device adopting the nitride semiconductor epitaxial stack structure disclosed in a sixth embodiment of the present disclosure.
Figure 6B:
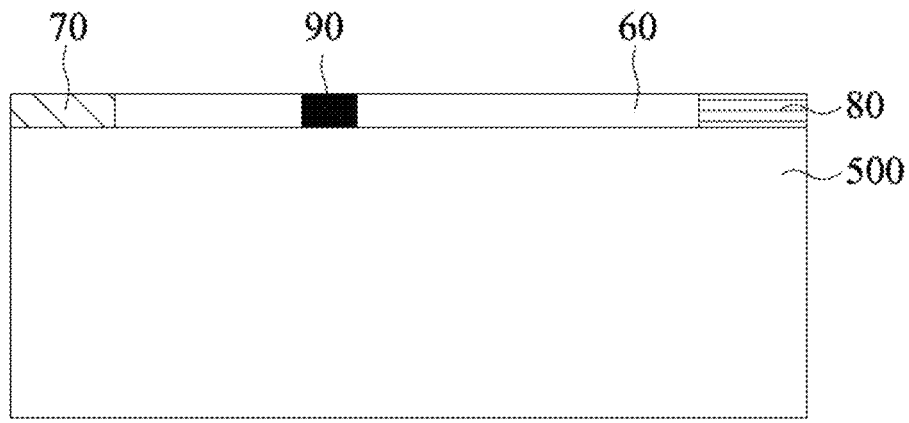
FIG. 6B is a cross sectional schematic diagram cut along a cross sectional line FF' of FIG. 6A.

FIGS. 6A to 6B show the schematic diagram of a top view of partial-enlarged schematic diagram of a power device in FIG. 5. FIG. 6A is a top view of partial-enlarged schematic diagram of a power device adopting the nitride semiconductor epitaxial stack structure of a sixth embodiment of the present disclosure. FIG. 6B is a cross-sectional schematic diagram cut along a cross-sectional line FF' of FIG. 6A. The power device unit E1 can be a FET, including a nitride semiconductor epitaxial stack structure 500 adopting the sixth embodiment of the present disclosure, a source electrode 70, a drain electrode 80 and a gate electrode 90. As shown in FIG. 5, in the power device unit E1, the source electrode pad S70 electrically connects the source electrode 70, the drain electrode pad S80 electrically connects the drain electrode 80, and the gate electrode pad S90 electrically connects the gate electrode 90. The nitride semiconductor epitaxial stack structure 500 is correspondingly disposed under the electrodes, as shown in FIG. 6B.

A protection layer (not shown) can be further formed on the surface of the power device unit E1 to cover those surfaces of the dielectric layer 60, the source electrode 70, the drain electrode 80 and the gate electrode 90 to prevent the entire electricity of the power device unit E1 being influenced. The protection layer can be oxide or nitride, for example, the oxide can be $SiO_x$ or $Al_2O_3$, and the nitride can be $Si_3N_4$ or GaN. Then, by etching the protection layer, partial source electrode 70, partial grain electrode 80 and gate electrode 90, that is, each of the source electrode pad S70, drain electrode pad S80 and gate electrode pad S90 can have partial surface not covered by the protection layer to facilitate the electrical connection to outside. In the present disclosure, the position not covered by the protection layer can be the source electrode pad S70, drain electrode pad S80 and gate electrode pad S90 directly connecting the source electrode 70, the drain electrode 80 and the gate electrode 90.

Figure 7:
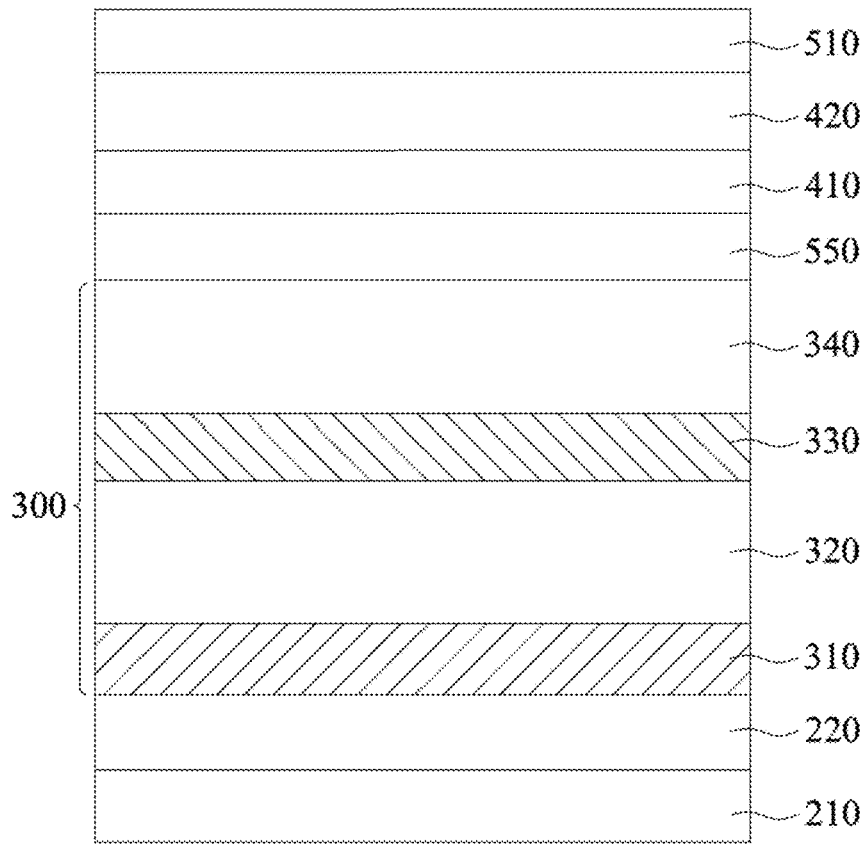
FIG. 7 is a detailed cross sectional schematic diagram of a nitride semiconductor epitaxial stack structure disclosed in a sixth embodiment of the present disclosure.

FIG. 7 is a detailed cross sectional schematic diagram of a nitride semiconductor epitaxial stack structure 500 of the sixth embodiment of the present disclosure. In the present embodiment, the nitride semiconductor epitaxial stack structure 500 is similar to the first embodiment and has the same labeled number with the first embodiment. Notably, in the present embodiment, a back barrier layer 550 is inserted between the buffer structure 300 and the channel layer 410. A preferred composition of the back barrier layer 550 is an AlGaN layer having higher Al composition ratio than the second GaN based thick layer 340. When the power device is manufactured based on the nitride semiconductor epitaxial stack structure 500, the back barrier layer 550 having higher Al composition ratio than the second GaN-based thick layer 340 can have higher bandgap to trap electrons and to prevent electrons being trapped by the epitaxial defects in the buffer structure 300 to affect the 2DEG stability of heterojunction when the device is under operation. That is, the extent of current collapse when the device is repeatedly operated can be decreased.

Notably, in the present embodiment, the thickness of the back barrier layer 550 is preferably not thicker than 50 nm for preventing the high bandgap of the back barrier layer 550 from raising the energy barrier level so as to influence the current intensity when the device is under operation.

In addition, as shown in FIG. 6B, in the present embodiment, a dielectric layer 60 can be formed on the upper surface of the cap layer 510 before forming the source electrode 70, the drain electrode 80 and the gate electrode 90. The dielectric layer 60 can be selectively disposed under the gate electrode 90 (not shown). When the dielectric layer 60 is under the gate electrode 90, by selecting different dielectric constant of the dielectric layer 60 and adjusting the thickness of the dielectric layer 60, surface current leakage can be lowered, and the range of operational bias of the gate electrode 90 can be raised, therefore enhancing the device reliability. The dielectric layer 60 can be oxide or nitride. For example, the oxide can be $SiO_x$ or $Al_2O_3$, and the nitride can be $Si_3N_4$ or GaN. However, the present disclosure is not limited thereto, and in another embodiment, the dielectric layer 60 can be omitted.

In the present embodiment, as the prior description, forming the source electrode 70, the drain electrode 80 and the gate electrode 90 above the nitride semiconductor epitaxial stack structure 500, and those electrodes electrically connecting the source electrode pad S70, the drain electrode pad S80 and the gate electrode pad S90 to be the end points electrically connecting to outside. As shown in FIG. 6B, in a side view of the power device E1, the source electrode 70 and the drain electrode 80 are on two sides of a surface of the nitride semiconductor epitaxial stack structure 500, and the gate electrode 90 is disposed between the source electrode 70 and the drain electrode 80. In the present embodiment, by properly selecting the materials of the source electrode 70 and the drain electrode 80, and/or by process such as etching or thermal annealing, the source electrode 70, drain electrode 80 and the barrier layer 420 can form ohmic contact. Similarly, by properly selecting the material of the gate electrode 90, the gate electrode 90 and the barrier layer (not shown) can form Schottky contact. The materials of the source electrode 70 or the drain electrode 80 can be Ti and Al or the combination thereof, and the material of the gate electrode 80 can be Ni, Au, W, TiN or the combination thereof, but the materials of the electrodes are not limited to above listed materials.

In other embodiments, the nitride semiconductor epitaxial stack structure 500 of the power device S can be replaced by that of any embodiment of the present disclosure, or partially replaced in accordance with that the buffer structure thereof is replaced.

Figure 8:
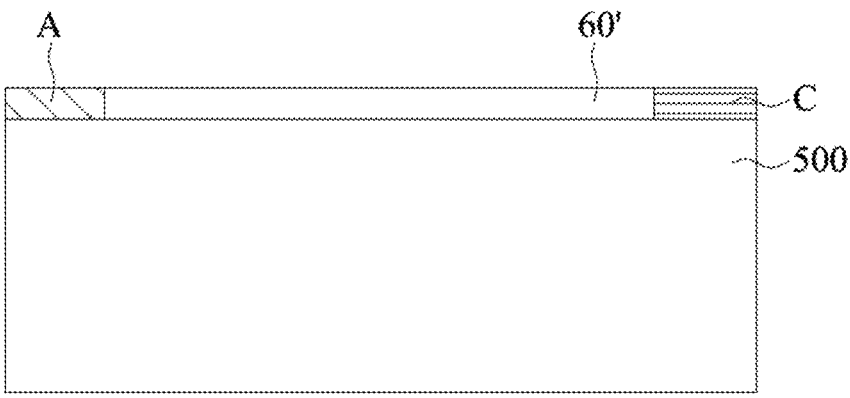
FIG. 8 is a side view schematic diagram of a Schottky diode device disclosed in a seventh embodiment of the present disclosure.

Referring to FIG. 8, a side view schematic diagram of a Schottky diode device of a seventh embodiment of the present disclosure is shown. The Schottky element unit E2 is manufactured by adopting the nitride semiconductor epitaxial stack structure 500 of the sixth embodiment of the present disclosure. The structure includes an anode electrode A and a cathode electrode C, formed on the top surface of the nitride semiconductor epitaxial stack structure 500 to be the end points electrically connecting to outside. Wherein the anode electrode A and the cathode electrode C are on two sides of a surface of the nitride semiconductor epitaxial stack structure 500. By properly selecting the materials of the anode electrode A and the cathode electrode C, and/or by process such as etching or thermal annealing, the anode electrode A or the cathode electrode C, form ohmic contact with the barrier layer. The material of the anode electrode A or the cathode electrode C can be Ti, Al or the combination thereof.

Similarly, a dielectric layer 60' can be formed on the upper surface of the nitride semiconductor epitaxial stack structure 500, and the forming step of the dielectric layer 60' can be before or after forming the anode electrode A and the cathode electrode B. The dielectric layer 60' can further lower the surface current leakage, therefore enhancing the device reliability. The dielectric layer 60' can be oxide or nitride. For example, the oxide can be SiOx or $Al_2O_3$ and the nitride can be $Si_3N_4$ or GaN. However, the present disclosure is not limited thereto, and in another embodiment, the dielectric layer 60' can be omitted.

Finally, referring to FIGS. 9A-9B and 10A-10B, FIGS. 9A-9B show an electricity test result chart of test units of a power device adopting a conventional nitride semiconductor epitaxial stack structure 100 and adopting the nitride semiconductor epitaxial stack structure 200 of the first embodiment, respectively.

Figure 9A:
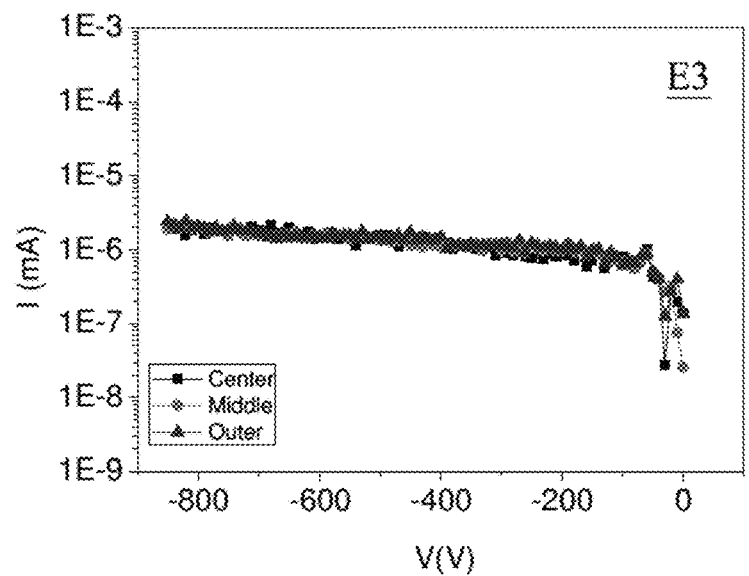
FIG. 9A is an electricity test result chart of test units of a power device adopting a conventional nitride semiconductor epitaxial stack structure.
Figure 9B:
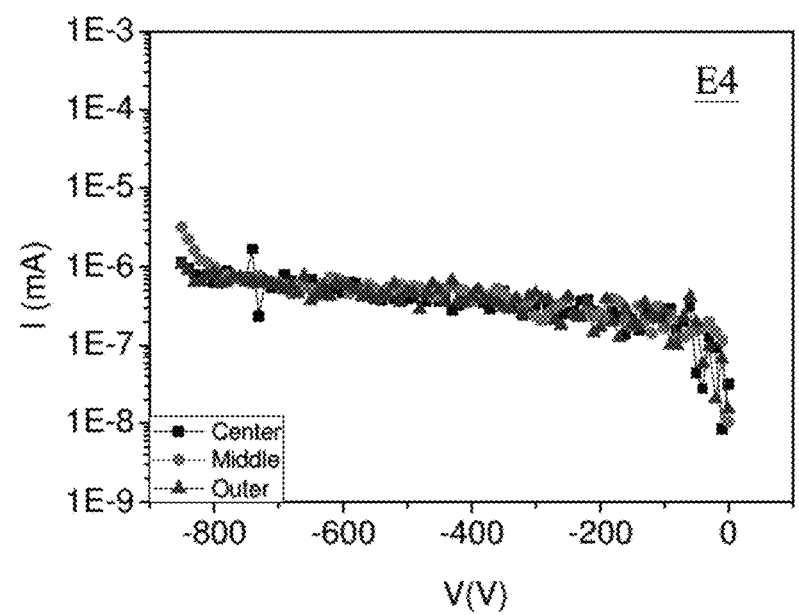
FIG. 9B is an electricity test result chart of test units of a power device adopting the nitride semiconductor epitaxial stack structure disclosed in the first embodiment.
Figure 10A:
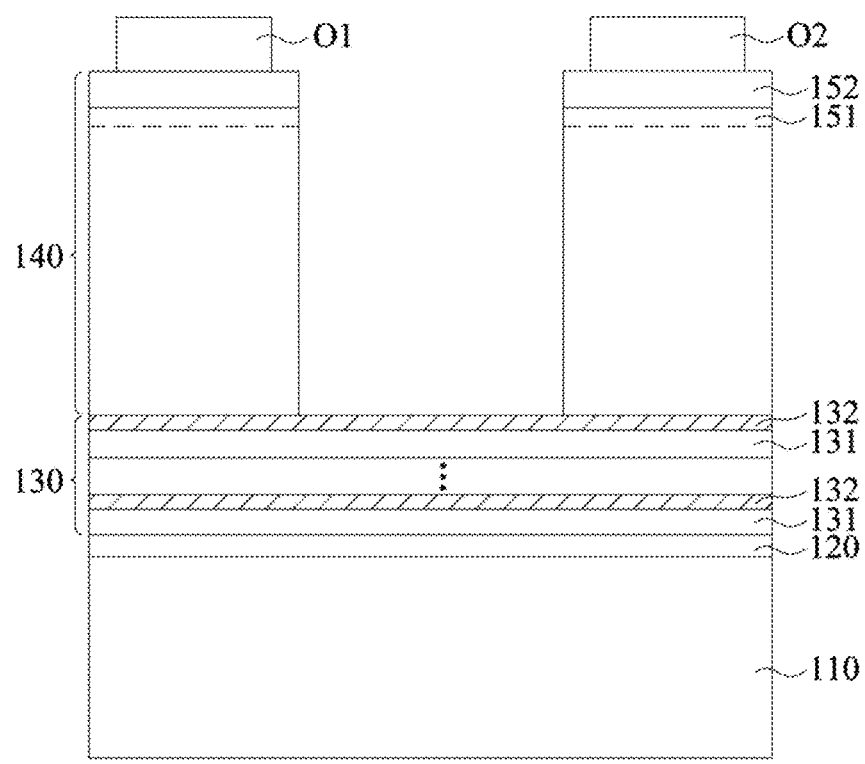
FIG. 10A is a side view schematic diagram of a power device test unit adopting a conventional nitride semiconductor epitaxial stack structure.
Figure 10B:
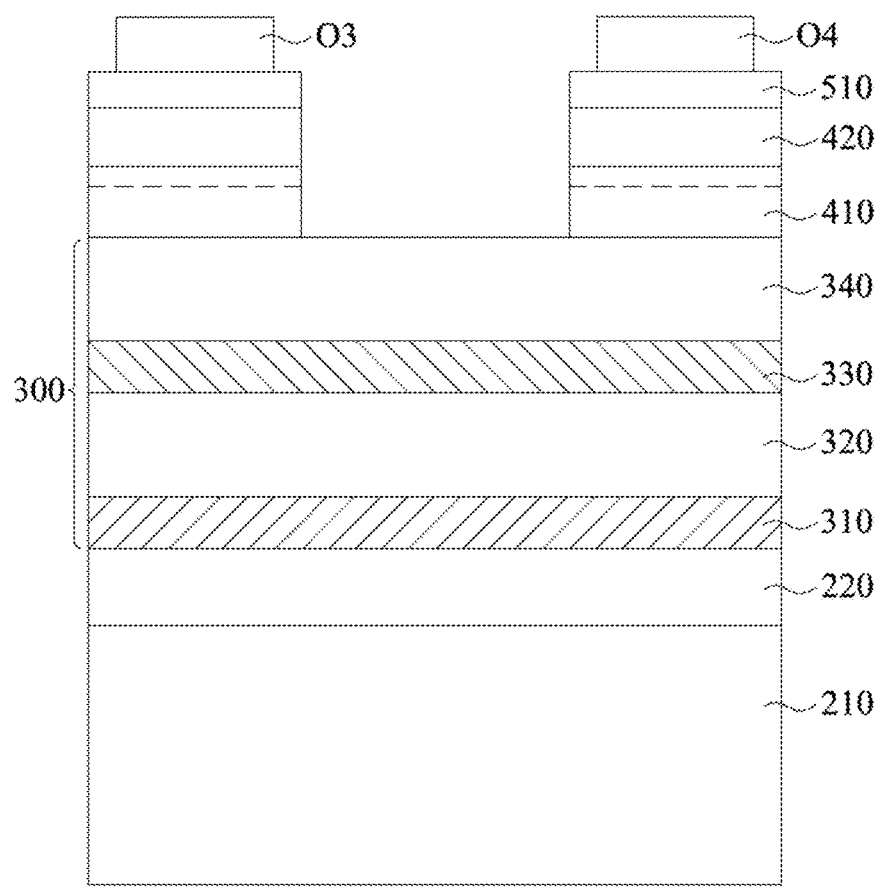
FIG. 10B is a side view schematic diagram of a power device test unit adopting the nitride semiconductor epitaxial stack structure disclosed in the first embodiment.

By proper processes, the power device test units E3 and E4 are formed on a conventional nitride semiconductor wafer and a nitride semiconductor wafer in accordance with the first embodiment of the present disclosure. Further, each semiconductor wafer is classified as a central region, a surrounding region and an outside region to be electrically tested by the power device test units E3 and E4. As shown in FIGS. 9A-9B, the electricity characteristics of the power devices are representatively measured in accordance with the classified regions, respectively, and from the electricity test result, three different trend lines of electricity test result are acquired in FIGS. 9A and 9B, respectively. FIGS. 10A-10b are side view schematic diagrams of power device test units E3 and E4, wherein the manufacturing of the power device test units is by defining multiple power device test units in a semiconductor epitaxial chip, and removing the central part of the grown nitride semiconductor epitaxial stack structures 100 and 200 including the channel 410, the barriers 152 and 420 and the cap layer 510, and forming ohmic electrode on the two unremoved sides of the nitride semiconductor epitaxial stack structures 100 and 200.

The test condition is that setting ohmic electrodes O1 and O3 on the left side as ground (0V), and applying corresponding reverse bias V=0~1000V to the ohmic electrodes O2 and O4 on the other side, as shown in the lateral coordinate of FIGS. 9A-9B; and testing the current leakage (I, unit: A) of the buffer structure part, as shown in the vertical coordinate of FIGS. 9A-9B. From FIGS. 9A-9B, the current leakage of the power device test unit E3 is about $1 \times 10^{-6}$ mA when applying a −600 V bias, which is higher than the current leakage $5 \times 10^{-7}$ mA tested by the power device test unit E4 when applying a −600 V bias. Even applying another bias value, the trends are similar, and the current-leakage condition of the power device test unit E4 drops about 0.5~1 degree comparing to the power device test unit E3.

By the embodiment based on the spirit of the present disclosure, a high-quality nitride semiconductor epitaxial stack structure can be formed, and the devices manufactured in accordance with the nitride semiconductor epitaxial stack structure, such as power device or Schottky device, the performance thereof can be enhanced by the enhanced quality of the nitride semiconductor epitaxial stack structure, therefore having industrial utilization. As being understood by a person skilled in the art, the foregoing preferred embodiments of the present application are illustrated of the present application rather than limiting of the present application. It is intended to cover various modifications and similar arrangements included within the spirit and scope of the appended claims, the scope of which should be accorded the broadest interpretation so as to encompass all such modifications and similar structure.

What is claimed is:

1. A nitride semiconductor epitaxial stack structure comprising:
  a silicon substrate;
  an aluminum-including nucleation layer disposed on the silicon substrate;
  a buffer structure disposed on the aluminum-including nucleation layer and sequentially comprising: a first superlattice epitaxial structure, a first GaN-based thick layer disposed on the first superlattice epitaxial structure, a second superlattice epitaxial structure disposed on the first GaN based thick layer, and a second GaN-based thick layer disposed on the second superlattice epitaxial structure;
  a channel layer disposed on the buffer structure;
  a barrier layer disposed on the channel layer; and
  a two dimensional electron gas layer disposed near an interface between the channel layer and the barrier layer,
  wherein the total thickness of the first GaN-based thick layer and the second GaN-based thick layer is more than 2 micrometers, and
  wherein the first GaN-based thick layer comprises a first Al composition ratio, the second GaN-based thick layer comprises a second Al composition ratio, and the first Al composition ratio is larger than the second Al composition ratio.

2. The nitride semiconductor epitaxial stack structure of claim 1, wherein the first superlattice epitaxial structure comprises alternate multiple AlN superlattice layers and AlGaN superlattice layers, wherein the second superlattice epitaxial structure comprises alternate multiple AlGaN superlattice layers and GaN superlattice layers.

3. The nitride semiconductor epitaxial stack structure of claim 1, wherein the channel is a GaN layer, and the barrier layer is an AlGaN layer.

4. The nitride semiconductor epitaxial stack structure of claim 1, further comprising an AlGaN back barrier layer disposed between the channel layer and the buffer structure, wherein the Al compositional ratio of the AlGaN back barrier layer is higher than that of the second GaN based thick layer.

5. The nitride semiconductor epitaxial stack structure of claim 1, wherein the thickness of the AlGaN back barrier layer is less or equal to 50 µm.

6. The nitride semiconductor epitaxial stack structure of claim 1, wherein the first superlattice epitaxial structure comprises a first Aluminum Gallium Nitride superlattice layer ($Al_{x1}Ga_{1-x1}N$) with a thickness $d_1$ and a second Aluminum Gallium Nitride superlattice layer ($Al_{y1}Ga_{1-y1}N$) with a thickness $d_2$, the second superlattice epitaxial structure comprises a third Aluminum Gallium Nitride superlattice layer ($Al_{x2}Ga_{1-x2}N$) with a thickness $d_3$ and a fourth Aluminum Gallium Nitride superlattice layer ($Al_{y2}Ga_{1-y2}N$) with a thickness $d_4$, and an average Al compositional ration of the first superlattice epitaxial structure is larger than that of the second superlattice epitaxial structure.

7. The nitride semiconductor epitaxial stack structure of claim 1, wherein the first superlattice epitaxial structure and/or the second superlattice epitaxial structure comprise an impurity, respectively, and the impurity comprises Fe or C.

8. The nitride semiconductor epitaxial stack structure of claim 7, wherein the first GaN based thick layer and/or the second GaN based thick layer comprises an impurity, respectively, and the impurity comprises at least one of Fe or C.

9. The nitride semiconductor epitaxial stack structure of claim 1, further comprising a GaN cap layer disposed above the barrier layer.

10. The nitride semiconductor epitaxial stack structure of claim 1, wherein the Al-including nucleation is an AlN layer.

11. A power device, comprising:
a nitride semiconductor epitaxial stack structure of claim 1; and
a source electrode, a gate electrode and a drain electrode, or a cathode electrode and an anode electrode are disposed on the nitride semiconductor epitaxial stack structure, respectively;
wherein the gate electrode is disposed between the source electrode and the drain electrode.

* * * * *